(12) United States Patent
Laforest et al.

(10) Patent No.: US 9,958,828 B2
(45) Date of Patent: May 1, 2018

(54) SYSTEM FOR ACQUIRING IMAGES BY MEANS OF HETERODYNE DIGITAL HOLOGRAPHY

(71) Applicant: Commissariat à l'Energie Atomique et aux Energies Alternatives, Paris (FR)

(72) Inventors: Timothé Laforest, Sivignon (FR); Antoine Dupret, Orsay (FR); Arnaud Verdant, Saint Nazaire les Eymes (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 90 days.

(21) Appl. No.: 15/109,108

(22) PCT Filed: Dec. 16, 2014

(86) PCT No.: PCT/EP2014/078019
§ 371 (c)(1),
(2) Date: Jun. 29, 2016

(87) PCT Pub. No.: WO2015/101482
PCT Pub. Date: Jul. 9, 2015

(65) Prior Publication Data
US 2016/0327904 A1    Nov. 10, 2016

(30) Foreign Application Priority Data

Dec. 31, 2013 (FR) ..................................... 13 63761

(51) Int. Cl.
*G03H 1/04*      (2006.01)
*H03M 3/00*      (2006.01)

(52) U.S. Cl.
CPC ......... *G03H 1/0443* (2013.01); *G03H 1/0465* (2013.01); *H03M 3/47* (2013.01); *G03H 2001/0463* (2013.01); *G03H 2226/11* (2013.01); *H03M 3/40* (2013.01); *H03M 3/494* (2013.01)

(58) Field of Classification Search
CPC ............... G03H 1/0443; G03H 1/0465; G03H 2226/11; G03H 2001/0463; H03M 3/47; H03M 3/40; H03M 3/494
See application file for complete search history.

(56) References Cited

U.S. PATENT DOCUMENTS

| 5,459,432 A | 10/1995 | White et al. |
| 5,617,090 A | 4/1997 | Ma et al. |
| 5,621,345 A | 4/1997 | Lee et al. |
| 5,667,373 A * | 9/1997 | Wright ................ G01S 7/52023 342/81 |

(Continued)

FOREIGN PATENT DOCUMENTS

WO    2008016582 A2    7/2008

OTHER PUBLICATIONS

Search Report for International Patent Application No. PCT/EP2014/078019 dated Feb. 9, 2015.

(Continued)

*Primary Examiner* — Hwa Lee
(74) *Attorney, Agent, or Firm* — Moreno IP Law LLC

(57) ABSTRACT

A system for acquiring images by means of heterodyne digital holography comprises an image sensor having at least one photodiode coupled to an oversampling analog-digital converter.

13 Claims, 6 Drawing Sheets

(56) References Cited

U.S. PATENT DOCUMENTS

| | | |
|---|---|---|
| 6,262,818 B1 | 7/2001 | Cuche et al. |
| 6,429,797 B1 | 8/2002 | Wu |
| 7,466,255 B1 | 12/2008 | Ignjatovic et al. |
| 8,094,058 B2 | 1/2012 | Jung et al. |
| 8,174,424 B2 | 5/2012 | Ignjatovic et al. |
| 2007/0071456 A1 | 3/2007 | Chen et al. |
| 2009/0051577 A1 | 2/2009 | Rzehak |

OTHER PUBLICATIONS

Farahi, Salma, et al., "Time resolved three-dimensional acousto-optic imaging of thick scattering media", Optics Letter, Optical Society of America, vol. 37, No. 13, Jul. 1, 201, pp. 2754-2756.

Le Clerc, F., et al., "Numerical heterodyne holography with two-dimensional photodetector arrays", Optics Letters, Optical Society of Americal, vol. 25, No. 10, May 15, 2000, pp. 716-718.

McIlrath, Lisa, et al., "Architecture for low-power real-time image analysis using 3D silicon technology", SPIE Conference on Helmet- and Head-Mounted Displays III, vol. 3362, Apr. 1998, pp. 184-195.

Lee, Yongmin, et al., "Multi-phase modulation for nematic liquid crystal on silicon backplane spatial light modulators usingpulse-width modulation driving scheme", Optics Communications 236 (2004), pp. 313-322.

Le Clerc, F., et al., "Numerical heterodyne holography with two-dimensional photodetector arrays", Optical Society of America, 2011, 4 pages.

Kim, Myung, "Principles and techniques of digital holographic microscopy", SPIE Reviews, vol. 1, 2010, 51 pages.

Bourquin, S., et al., "Two-dimensional smart detector array for interferometric applications", Electronics Letters, vol. 37, No. 15, Jul. 19, 2001, pp. 975-976.

Baumer, Christian, et al., "Design and Evaluation of a CMOS-Photosensor with In-Pixel Sigma-Delta Modulator for X-ray Computed Tomography", Proceedings of the 32nd European Solid-State Circuits Conference, 2006, pp. 432-435.

Walker, Richard, et al., "A 128x96 Pixel Event-Driven Phase-Domain $\Delta\Sigma$-Based Fully Digital 3D Camera in 0.13µm CMOS Imaging Technology", IEEE International Solid-State Circuits Conference, 2011, pp. 410-412.

Garcia, Julian, et al., "A Low-Power CT Incremental 3rd Order $\Delta\Sigma$ ADC for Biosensor Applications", IEEE Transactions on Circuits and Systems, vol. 60, No. 1, 2013, pp. 25-36.

Kang, Jin-Seong, et al., "Digital Driving Method for Low Frame Frequency and 256 Gray Scales in Liquid Crystal on Silicon Panels", Journal of Display Technology, vol. 8, No. 12, 2012, pp. 723-729.

Yamaguchi, Ichirou, et al., "Phase-shifting digital holography", Optics Letters, vol. 22, No. 16, 1997, pp. 1268-1270.

Atlan, Michael, et al., "Heterodyne holographic microscopy of gold particles", Optics Letters, vol. 33, No. 5, 2008, pp. 500-502.

Kikuchi, Yuichi, et al., "Doppler phase-shifting digital holography and its application to surface shape measurement", Optics Letters, vol. 35, No. 10, 2010, pp. 1548-1550.

Benoit a la Guillaume, Emilie, et al., "Acousto-optical coherence tomography with a digital holographic detection scheme", Optics Letters, vol. 37, No. 15, 2012, pp. 3216-3218.

Beer, Stephan, "Real-Time Photon-Noise Limited Optical Coherence Tomography Based on Pixel-Level Analog Signal Processing", Universite de Neuchatel, Centre Suisse d'Electronique et de Microtechnique, Doctoral Dissertation, 2006, 155 pages.

Written Opinion of the International Searching Authority for International Application No. PCT/EP2014/078019, 10 pages.

* cited by examiner

SYSTEM FOR ACQUIRING IMAGES BY MEANS OF HETERODYNE DIGITAL HOLOGRAPHY

BACKGROUND

The present application relates to the field of image acquisition, and more particularly aims at a system for acquiring images by heterodyne digital holography.

DISCUSSION OF THE RELATED ART

Digital holography generally designates techniques enabling to record, by means of a digital image sensor, the phase and the amplitude of a coherent light beam after reflection or transmission by an object.

Usual holography techniques are based on the use of the interference generated by the superposing of two coherent light beams, where the first one, or object beam, is transmitted or reflected by the object to be examined, and the second one, or reference beam, does not cross the object to be examined.

Heterodyne holography is a holography technique where the object beam and the reference beam are slightly frequency-shifted. An example of a system for acquiring images by heterodyne digital holography is for example described in the article entitled "Numerical heterodyne holography with two-dimensional photodetector arrays" of F. Le Clerc et al.

It is needed to at least partly improve certain aspects of existing systems for acquiring images by heterodyne digital holography.

SUMMARY

To achieve this, an embodiment provides a system for acquiring images by heterodyne digital holography, comprising: an image sensor having at least one photodiode coupled to an analog-to-digital converter; and an optical assembly enabling to simultaneously project onto the sensor first and second coherent light beams of different frequencies, wherein the converter is capable of acquiring, at a first frequency, analog samples representative of an output signal of the photodiode, of generating, at a second frequency equal to the first frequency or at a sub-multiple of the first frequency, first digital samples having a first resolution based on said analog samples, and of providing at a third frequency equal to a sub-multiple of the second frequency, second digital samples having a resolution greater than the first resolution, generated from the first digital samples, and wherein the first frequency of the converter is equal to an integral number n of times the system beat frequency, that is, the absolute value of the difference between the frequencies of the first and second beams.

According to an embodiment, the optical assembly comprises a single acousto-optic modulator.

According to an embodiment, the optical assembly comprises no acousto-optic modulator, and comprises an ultrasound source for exciting an object crossed by the second light beam.

According to an embodiment, the ultrasound source is capable of emitting an ultrasound wave during a first time interval of duration $\Delta t$, and the converter is capable of only acquiring samples representative of an output signal of the photodiode during a second time interval of same duration $\Delta t$, time-shifted with respect to the first time interval.

According to an embodiment, the ultrasound source is capable of emitting an ultrasound wave having a first random or pseudo-random sequence of phase jumps by 0 or $\pi$, and the converter is capable of receiving a binary signal representative of a second sequence of phase jumps identical to the first sequence but time-shifted with respect to the first sequence, and of modifying an analog sample processing sequence according to this binary signal.

According to an embodiment, n is equal to 4.

According to an embodiment, the converter comprises an analog sampling block capable of acquiring n analog samples of an output signal of the photodiode at each beat period of the system.

According to an embodiment, the analog sampling block is capable of analogically performing, for each beat period, one or a plurality of arithmetic operations based on said samples.

According to an embodiment, the converter is capable of providing, after an integral number N of beat periods of the system, a first digital signal over m bits, representative of the real part of the complex field of the second light beam, and a second digital signal over m bits, representative of the imaginary part of the complex field of the second light beam, where m is an integer greater than or equal to 1.

According to an embodiment, m is equal to $\log_2$.

According to an embodiment, the converter comprises an integrator comprising two integration capacitors.

According to an embodiment, the converter comprises two integrators each comprising one integration capacitor.

According to an embodiment, the sensor further comprises a high-pass filtering circuit between the photodiode and the converter.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
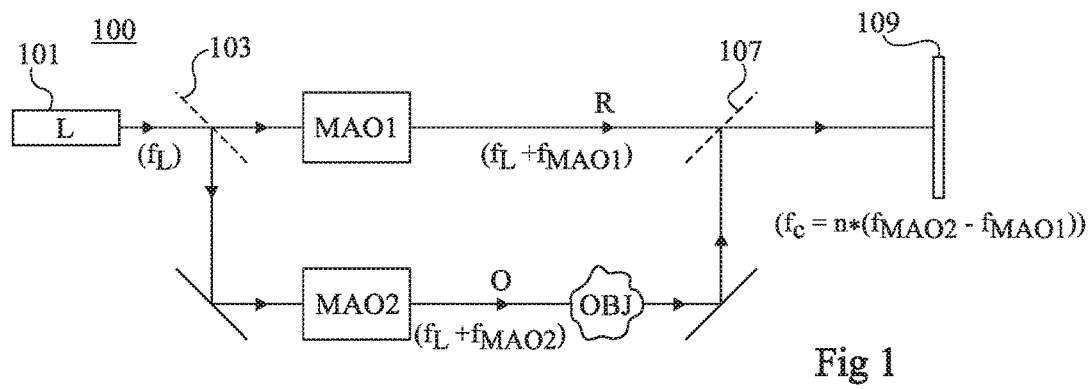
FIG. 1 schematically shows an example of a system for acquiring images by heterodyne digital holography.

For clarity, the same elements have been designated with the same reference numerals in the various drawings and, further, the various drawings are not to scale. Further, only those elements which are useful to the understanding of the described embodiments have been detailed. In particular, the various uses which may be made of a system for acquiring images by heterodyne digital holography have not been detailed, the described embodiments being compatible with all known applications of heterodyne digital holography.

FIG. 1 schematically shows an example of a system 100 for acquiring images by heterodyne digital holography.

System 100 comprises a light source 101 (L) capable of generating a coherent light beam of frequency $f_L$, for example, a laser source. System 100 further comprises a splitter 103, for example, a partly transparent and partly reflective blade 103 placed with a 45-degree angle relative to the emission direction of source 101, enabling to divide into two portions the beam generated by source 101. At the output of splitter 103, a first beam portion, or reference beam R, is modulated by a first acousto-optic modulator MAO1 shifting its frequency by a value $f_{MAO1}$, and a second beam portion, or object beam O, is modulated by a second acousto-optic modulator MAO2 shifting its frequency by a value $f_{MAO2}$ different from value $f_{MAO1}$. The system is arranged so that the object beam, of frequency $f_L+f_{MAO2}$, illuminates an object 105 (OBJ) to be examined, while the reference beam, of frequency $f_L+f_{MAO1}$, does not cross object 105. The reference beam and the object beam reflected or transmitted by object 105 are then directed towards a recombination element 107, for example, a beam splitter, which recombines them. The resulting beam provided by element 107, comprising both the object signal and the reference signal, is projected on an image sensor 109 comprising a pixel array (not shown in FIG. 1).

In operation, sensor 109 sees an interference pattern having a beat frequency $f_B$ equal to the absolute value of the frequency difference between the object beam and the reference beam, that is, at the absolute value of difference $f_{MAO2}-f_{MAO1}$.

Figure 2:
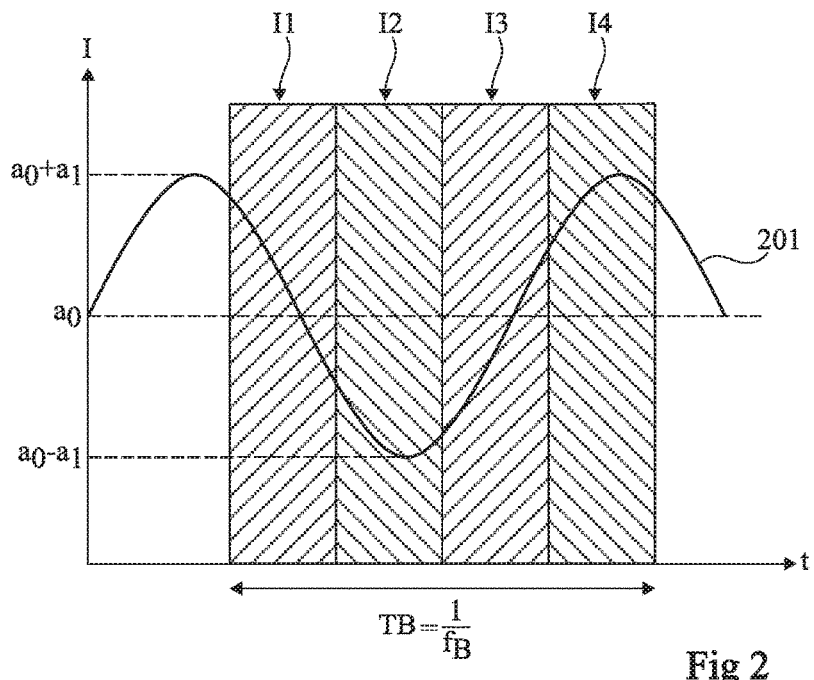
FIG. 2 is a diagram illustrating an example of operation of the system of FIG. 1.

FIG. 2 is a diagram illustrating in further detail the operating principle of the system of FIG. 1.

The diagram of FIG. 2 comprises a curve 201 showing the time variation of the light intensity I received by a pixel of sensor 109 of the system of FIG. 1, when sensor 109 is illuminated by the beam provided by element 107, combining the object beam of frequency $f_L+f_{MAO2}$ and the reference beam of frequency $f_L+f_{MAO1}$. As appears in the drawing, the received intensity I varies in sinusoidal fashion around an average value or DC component $a_0$, with a peak amplitude of value $a_1$, at a frequency equal to beat frequency $f_B$ of the system. The light intensities received by different pixels of sensor 109 may have different DC components $a_0$ and/or different amplitudes $a_1$, but all fluctuate in sinusoidal fashion at beat frequency $f_B$, with specific phase-shifts.

In this example, acquisition frequency $f_C$ of image sensor 109 is equal to four times beat frequency $f_B$ of the system. Thus, for a given pixel, sensor 109 outputs four values I1, I2, I3, and I4 within one beat period $T_B=1/f_B$ of the system.

When four successive output values phase-shifted by $\pi/2$, that is, separated by a time interval $T_B/4$, have been acquired for each sensor pixel, that is, when four successive images have been acquired by the sensor, complex field $E_O$ of the object beam received by sensor 109 may be determined, for each sensor pixel, by formula $E_O=(I1-I3)+j(I2-I4)$. Component I1−I3 corresponds to the real part of field $E_O$, and component I2−I4 corresponds to the imaginary part of field $E_O$. Phase $P_O$ and amplitude $A_O$ of the object signal received by each pixel of the sensor may be determined by the following formulas:

$$P_O=\arctan((I2-I4)/(I1-I3)), \text{ and } A_O=\sqrt{(I1-I3)^2+(I2-I4)^2}.$$

It should be noted that ratio n between beat frequency $f_B$ of the system and acquisition frequency $f_C$ of the image sensor may be an integer different from 4, for example, n=2, n=3, or n=5. In this case, the operating principle is similar to what has been previously described, that is, for each pixel, the sensor acquires n output values phase-shifted by $2\pi/n$ within a beat period $T_B=1/f_B$, after which these values are used to determine, pixel by pixel, by adapted calculation formulas (different from the formulas mentioned hereabove for case n=4), amplitude $A_O$ and phase $P_O$.

Figure 3:
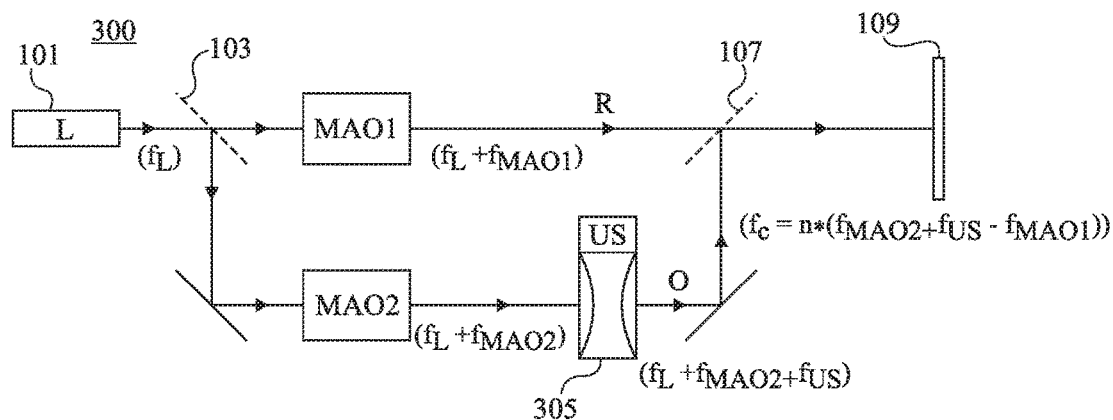
FIG. 3 schematically shows another example of a system for acquiring images by heterodyne digital holography.

FIG. 3 schematically shows another example of a system 300 for acquiring images by heterodyne digital holography. System 300 comprises elements common with system 100 of FIG. 1. Only the differences between the two systems will be detailed hereafter.

System 300 comprises, like system 100 of FIG. 1, a light source 101, a splitter 103 capable of dividing a beam provided by source 101 into an object beam and a reference beam, a first acousto-optic modulator MAO1 capable of shifting the frequency of the reference beam by a value $f_{MAO1}$, and a second acousto-optic modulator MAO2 capable of shifting the frequency of the reference beam by a value $f_{MAO2}$. System 300 is arranged so that the object beam, of frequency $f_L+f_{MAO2}$, illuminates an object or sample 305 to be analyzed, and that the reference beam, of frequency $f_L+f_{MAO1}$, does not cross object 305.

In system 300, a portion of object or sample 305 is excited by a focused ultrasound wave of frequency $f_{US}$. As a result, the frequency of the rays of the object beam crossing the excited portion of the sample is shifted to value $f_L+f_{MAO2}+f_{US}$, while the frequency of the rays of the object beam crossing the non-excited portions of the sample remains at value $f_L+f_{MAO2}$. Such a frequency shift enables to "mark" the photons of the object beam having crossed the excited portion of the sample with respect to the other photons of the object beam.

The reference beam and the object beam are then directed towards a recombination element 107. The resulting beam provided by element 107, comprising both the object signal and the reference signal, is projected onto an image sensor 109.

In system 300, beat frequency $f_B$ of the system is defined as being the absolute value of the frequency difference between the reference beam and the portion of the object beam having crossed the excited portion of sample 305. Thus, beat frequency $f_B$ of system 300 is equal to the absolute value of difference $f_{MAO2}+f_{US}-f_{MAO1}$. Acquisition frequency $f_C$ of image sensor 109 is, as in the previous example, equal to n times beat frequency $f_B$ of the system, where n is an integer, for example, equal to four.

The operating principle of system 300 is similar to what has been previously described in relation with FIGS. 1 and 2, that is, for each pixel, the sensor acquires n successive output values phase-shifted by $2\pi/n$ within one beat period $T_B=1/f_B$ of the system. Such output values are then used to determine, pixel by pixel, by means of adapted calculation formulas, the complex field of the object beam portion modulated by sample 305, and to deduce therefrom information relative to the excited portion of sample 305.

A more detailed embodiment of a system using the ultrasound light marking technique combined with the heterodyne digital holography technique is described in the article entitled "Acousto-optic Coherence Tomography with a digital holographic detection scheme" of Emilie Benoit a la Guillaume et al.

A disadvantage of systems for acquiring images by heterodyne digital holography of the type described in relation with FIGS. 1 to 3 lies in the complexity, the cost, and the bulk of acousto-optic modulators. Further, acousto-optic modulators cause a relatively large attenuation of light beams, which compels to provide a relatively powerful light source 101.

It should be noted that usual acousto-optic modulators may typically shift the frequency of a light beam by a value in the range from a few MHz to a few tens of MHZ, for example, by a value in the range from 5 to 100 MHz. Further, in the system of FIG. 3, the ultrasound excitation of a portion of the object to be analyzed may cause a frequency shift of the light crossing the excited portion of the object by a value in the range from a few hundreds of kHz to a few MHz, for example, by a value in the range from 1 to 15 MHz. Now, acquisition frequency $f_C$ of usual image sensors is typically in the range from a few tens of Hz to a few tens of kHz, for example, between 20 Hz and 20 kHz. This is why, in systems of the type described in relation with FIGS. 1 to 3, to obtain a beat frequency $f_B$ smaller by a factor n than acquisition frequency $f_C$ of the sensor ($f_B=f_C/n$), two acousto-optic modulators are provided. Indeed, even though interferences could be obtained between the object beam and the reference beam with a single acousto-optic modulator in the system of FIG. 1, or with no acousto-optic modulator in the system of FIG. 3, the beat frequency of such interferences would then be much too high as compared with the image sensor acquisition frequency to allow an operation of the type described in relation with FIG. 2.

As a non-limiting illustrative example: in the system of FIG. 1, sensor 109 may have a 8-kHz acquisition frequency $f_C$ and frequency shifts $f_{MAO1}$ and $f_{MAO2}$ introduced by modulators MAO1 and MAO2 may respectively be 79.999 MHz and 80.001 MHz to obtain a beat frequency $f_B=f_{MAO2}-f_{MAO1}=2$ kHz$=f_C/4$; and, in the system of FIG. 3, sensor 109 may have a 8-kHz acquisition frequency $f_C$, and frequency shifts $f_{MAO1}$, $f_{MAO2}$, and $f_{US}$ introduced by modulators MAO1 and MAO2 and by the ultrasound wave for exciting sample 305 may respectively be 79.999 MHz, 77.001 MHz, and 3 MHz, to obtain a beat frequency $f_B=f_{MAO2}+f_{US}-f_{MAO1}=2$ kHz$=f_C/4$.

Another disadvantage of systems for acquiring images by heterodyne digital holography of the type described in relation with FIGS. 1 to 3 is due to the saturation thresholds of the sensor pixels, which limit the light power which may be received by the sensor. Indeed, the light power received by each sensor pixel should be sufficiently low to avoid saturating the pixel before the end of an integration period $T_B/n$ of the pixel, which may be a problem in certain applications.

Another disadvantage of systems of the type described in relation with FIGS. 1 to 3 is that the signal-to-noise ratio at the system output is relatively low, particularly due to the fact that a significant part of the charges photogenerated in each pixel during an integration period $T_B/n$ of the pixel corresponds to DC component $a_0$ of the signal, which is no longer used after the reconstruction of the object signal. As an example, in the system described in relation with FIGS. 1 and 2, DC component $a_0$ of intensity I received by a pixel of sensor 109 is equal to the sum of light intensity $I_O$ of the object beam at the level of this pixel and of light intensity $I_R$ of the reference beam at the level of this pixel, and peak amplitude $a_1$ of intensity I received by the pixel is expressed by formula $a_1=\sqrt{I_R I_O} \cos(\phi_R-\phi_O)$, $\phi_R$ and $\phi_O$ respectively being the phase of the reference beam and the phase of the object beam. Peak amplitude $a_1$ corresponds to the useful part of the signal received by the sensor and enables, in particular, to reconstruct the phase and the amplitude of the object beam. It is thus desirable for value $a_1$ to be the highest possible. However, if the total light power provided to the sensor is increased to increase the value of component $a_1$, this causes a squared increase of DC component $a_0$. The signal-to-noise ratio is thus not significantly improved and the pixel saturation threshold risks being reached before the end of an integration period $T_B/n$ of the pixel.

An object of the embodiments described hereafter is to provide a system for acquiring images by heterodyne digital holography enabling to overcome all or part of the above-mentioned disadvantages.

According to an aspect of the described embodiments provides a system for acquiring images by heterodyne digital holography, comprising an oversampling images sensor, that is, an image sensor having at least one photodiode coupled to an analog-to-digital converter, for example, a sigma-delta converter, is provided.

As will be explained in further detailed hereafter, the use of an oversampling image sensor in a system for acquiring images by heterodyne digital holography enables to form a system operating with a beat frequency $f_B=f_{Cs}/n$, where $f_{Cs}$ is the sensor oversampling frequency. As an example, oversampling frequency $f_{Cs}$ may be in the range from 1 MHz to 100 MHz. A system operating with a beat frequency $f_B$ in the range from several MHz to several tens of MHz can thus be formed. This enables to form a particularly simple, inexpensive, and low-bulk system for acquiring images by heterodyne digital holography. In particular, this enables, as illustrated in FIGS. 4 and 5, to spare an acousto-optic modulator with respect to a system of the type described in relation with FIG. 1, or two acousto-optic modulators with respect to a system described in relation with FIG. 3.

Figure 4:
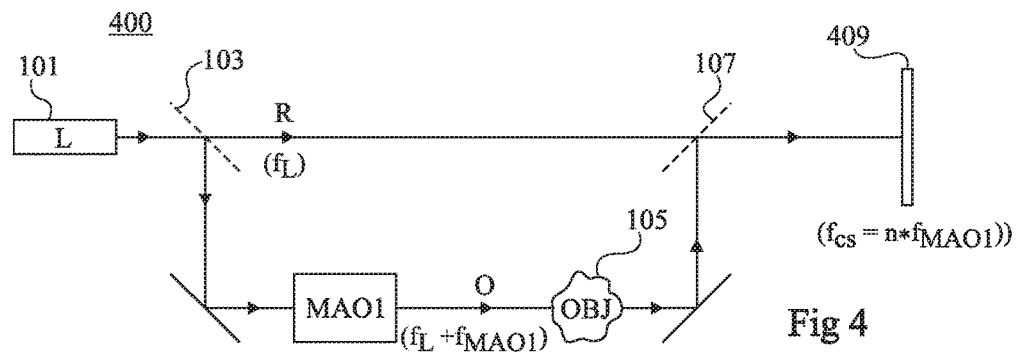
FIG. 4 schematically shows an embodiment of a system for acquiring images by heterodyne holography.
Figure 5:
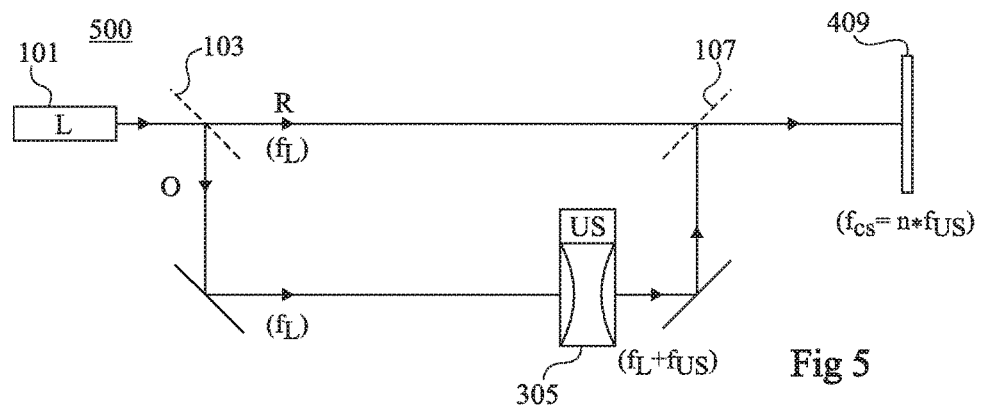
FIG. 5 schematically shows another embodiment of a system for acquiring images by heterodyne holography.

FIG. 4 schematically shows an embodiment of a system 400 for acquiring images by heterodyne digital holography. System 400 comprises elements common with system 100 of FIG. 1. Only the differences between systems 100 of FIG. 1 and 400 of FIG. 4 will be detailed hereafter.

System 400 comprises, like system 100 of FIG. 1, a light source 101 capable of generating a coherent light beam of frequency $f_L$, and a splitter 103 capable of dividing a beam provided by source 101 into an object beam O and a reference beam R. In the example of FIG. 4, object beam O is modulated by an acousto-optic modulator MAO1 shifting its frequency by a value $f_{MAO1}$, for example, in the range from 5 and 100 MHz, and reference beam R is not modulated by an acousto-optic modulator and thus remains at frequency $f_L$. As a variation, acousto-optic modulator MAO1 may be arranged to modulate reference beam R rather than object beam O. System 400 is arranged so that the object beam, of frequency $f_L+f_{MAO1}$, illuminates an object 105 (OBJ) to be examined or analyzed, while the reference beam, of frequency $f_L$, does not cross object 105. The reference beam and the object beam reflected or transmitted by object 105 are then directed towards a recombination element 107 which recombines them. The resulting beam provided by element 107, comprising both the object signal and the reference signal, is projected on an oversampling image sensor 409, comprising one or a plurality of pixels (not shown in FIG. 4), for example, a pixel array, each pixel comprising a photodiode coupled to an oversampling analog-to-digital converter.

In operation, sensor 409 sees an interference pattern having a beat frequency $f_B$ equal to the absolute value of the frequency difference between the object beam and the reference beam, that is, equal to value $f_{MAO1}$. Beat frequency $f_B = f_{MAO1}$ of the system is selected so that oversampling frequency $f_{Cs}$ of sensor 409 is equal to an integral number n of times beat frequency $f_B$, for example $f_{Cs} = 4*f_B$.

FIG. 5 schematically shows an embodiment of a system 500 for acquiring images by heterodyne digital holography. System 500 comprises elements common with system 300 of FIG. 3. Only the differences between systems 300 of FIG. 3 and 500 of FIG. 5 will be detailed hereafter.

Like system 300 of FIG. 3, system 500 comprises a light source 101 capable of generating a coherent light beam of frequency $f_L$, and a splitter 103 capable of dividing a beam provided by source 101 into an object beam O and a reference beam R. System 500 is arranged so that object beam O illuminates an object or sample 305 to be analyzed, and that the reference beam does not cross object 305. In the example of FIG. 5, the reference beam is not modulated by an acousto-optic modulator and thus remains at frequency $f_L$, and the object beam is not modulated by an acousto-optic modulator and thus also remains at frequency $f_L$ before reaching object 305. In system 500, a portion of object or sample 305 is excited by a focused ultrasound wave of frequency $f_{US}$, for example in the range from 1 to 15 MHz. As a result, the frequency of the rays of the object beam crossing the excited portion of the sample is shifted to value $f_L + f_{US}$, while the frequency of the rays of the object beam crossing the non-excited portions of the sample remains at value $f_L$. Such a frequency shift enables, similarly to what has been described in the example of FIG. 3, to "mark" the photons of the object beam having crossed the excited portion of the sample with respect to the other photons of the object beam. The reference beam and the object beam are then directed towards a recombination element 107. The resulting beam provided by element 107, comprising both the object signal and the reference signal, is projected onto an oversampling image sensor 409 which may be identical or similar to that of FIG. 4.

In operation, sensor 409 sees an interference pattern having a beat frequency $f_B$ equal to the absolute value of the frequency difference between the reference beam and the portion of the object beam having crossed the excited portion of sample 305, that is, equal to value $f_{US}$. Beat frequency $f_B = f_{US}$ of system 500 is selected to be such that oversampling frequency $f_{Cs}$ of sensor 409 is equal to an integral number n of times beat frequency $f_B$, for example, $f_{Cs} = 4*f_B$.

Figure 6A:
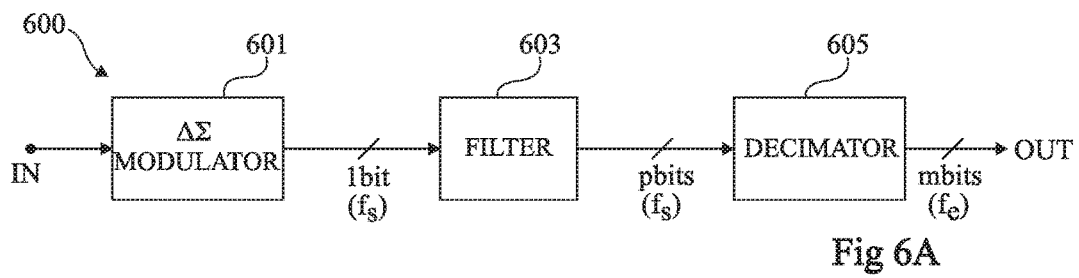
FIGS. 6A and 6B schematically show an embodiment of a sigma-delta oversampling analog-to-digital converter.
Figure 6B:
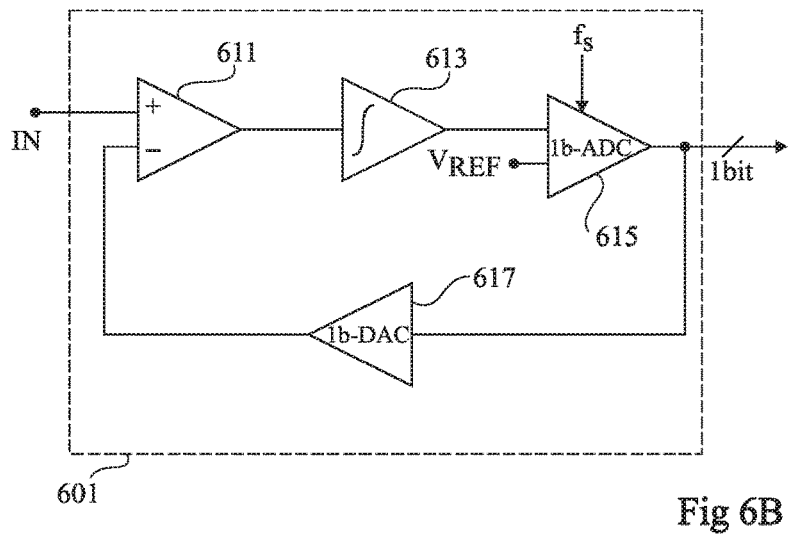

FIGS. 6A and 6B schematically show, in the form of blocks, an embodiment of a sigma-delta oversampling analog-to-digital converter 600. FIG. 6A is a general view of converter 600 and FIG. 6B shows in more detailed fashion a modulation block of converter 600.

Converter 600 comprises an input IN capable of receiving an analog signal to be digitized, and an output OUT capable of supplying, at a sampling frequency $f_e$, digitized output samples over m bits, where m is an integer greater than or equal to 1.

Converter 600 comprises an oversampling modulator 601 (ΔΣ MODULATOR) which receives as an input the analog signal applied to input IN of the converter, and outputs a sequence of low-resolution intermediate samples, 1-bit samples in this example, at an oversampling frequency $f_s$ higher than sampling frequency $f_e$, for example, equal to a multiple of sampling frequency $f_e$.

Modulator 601 is shown in more detailed fashion in FIG. 6B. It comprises an analog subtraction circuit 611 having two inputs, respectively positive (+) and negative (−), and one output. The circuit may for example be formed by a switched-capacitor assembly. The positive input of circuit 611 is connected to input IN of converter 600, and the output of circuit 611 is connected to an input of an analog integrator 613, which may for example comprise a capacitor in feedback relation with an amplifier. Modulator 601 further comprises a comparator 615 rated at oversampling frequency $f_s$ of the converter. Comparator 615 has a first input connected to an output of integrator 613, and a second input capable of receiving a reference signal $V_{REF}$. The output of comparator 615 corresponds in this example to the output of modulator 601. In operation, comparator 615 compares, at frequency $f_s$, the output signal of integrator 613 with reference signal $V_{REF}$, and outputs a digital signal over 1 bit corresponding to the result of the comparison. The output of comparator 615 is further connected to the input of a 1-bit digital-to-analog converter 617, the output of converter 617 being connected to the negative input of circuit 611.

Converter 600 further comprises a digital filter 603 (FILTER) which receives as an input the intermediate 1-bit samples provided by modulator 601, and outputs, at oversampling frequency $f_s$, a sequence of digital intermediate samples of p bits per sample, where p is an integer greater than or equal to m. Filter 603 especially has the function of generating high-resolution samples representative of the analog input signal from the 1-bit samples provided by modulator 601, and of performing a low-pass filtering enabling to greatly suppress the noise introduced by modulator 601. As an example, filter 603 comprises a digital integrator of order 1, that is, a counter which sums up successive samples of the output signal of modulator 601. In this specific case, number p of bits of the intermediate samples at the output of filter 603 is equal to number m of bits of the output samples of converter 600.

Converter 600 further comprises a subsampling circuit 605 (DECIMATOR) which receives as an input the intermediate p-bit samples provided by filter 603 at frequency $f_s$, and outputs a sequence of output samples of m bits per sample, at sampling frequency $f_e$ or output frequency of converter 600. The output of subsampling circuit 605 is connected to output OUT of converter 600.

Figure 7:
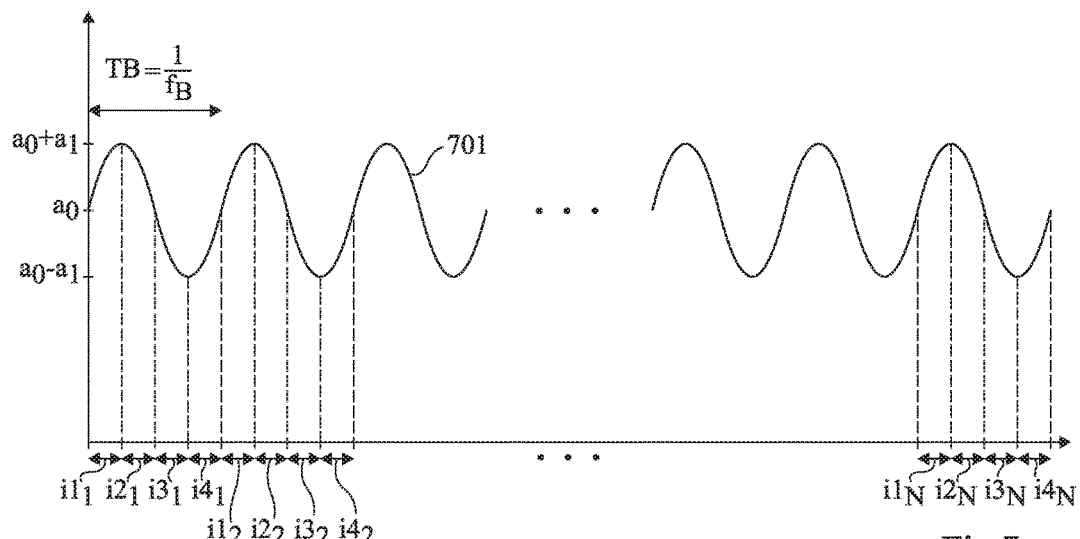
FIG. 7 is a diagram schematically illustrating an example of operation of an embodiment of a system for acquiring images by heterodyne digital holography.

FIG. 7 is a diagram schematically illustrating an example of operation of a system for acquiring images by heterodyne digital holography comprising an oversampling image sensor, for example, a system of the type described in relation with FIG. 4 or 5.

The diagram of FIG. 7 comprises a curve 701 showing the time variation of the light intensity I received by a pixel of sensor 409 of the system, when sensor 409 is illuminated by the beam provided by element 107, combining the object beam and the reference beam. As appears in the drawing, the received intensity I varies in sinusoidal fashion around an average value or DC component $a_0$, with a peak amplitude of value $a_1$, at a frequency equal to beat frequency $f_B$ of the system ($f_B = f_{MAO1}$ in the example of FIG. 4 and $f_B = f_{US}$ in the example of FIG. 5). The light intensities received by different pixels of sensor 409 may have different DC components $a_0$ and/or different amplitudes $a_1$, but all fluctuate in sinusoidal fashion at beat frequency $f_B$, with specific phase-shifts.

In this example, oversampling frequency $f_{Cs}$ of image sensor 409 is equal to n=4 times beat frequency $f_B$ of the system. Unlike the systems of FIGS. 1 to 3 where, for a given pixel of sensor 109, the acquisition of the complex field of the object beam at the pixel level may be performed within a beat period $T_B$ of the system, in the embodiment of FIG. 7, for a given pixel of sensor 409, an acquisition of the complex field of the object beam received at the pixel level is performed in N beat periods $T_B$, where N is an integer greater than 1.

For each beat period $T_B$ of a period $N*T_B$ of acquisition of the complex field of the object beam at the pixel level, four analog pixel output values $i1_i$, $i2_i$, $i3_i$, and $i4_i$ are acquired at successive times shifted by $T_B/4$ (that is, with a $\pi/2$ phase shift), where i is an integer in the range from 1 to N. This thus comes down, in the present example, to the observation, during acquisition period $N*T_B$, of four DC signals i1, i2, i3, and i4 sampled at frequency $f_B$. It should be noted that if the pixel provides a signal representative of a storage of photogenerated charges in its photodiode, the pixel photodiode may be reset between two successive acquisitions of an analog output value of the pixel. If, however, the pixel photodiode is biased to a fixed reference voltage and if the pixel provides a signal representative of a photocurrent flowing through the photodiode, it is possible not to reset the pixel between two successive acquisitions of an analog output value of the pixel. An oversampling analog-to-digital converter coupled to the pixel photodiode, for example, a converter of sigma-delta type, may supply, at the end of acquisition period $N*T_B$, for each of the observed DC signals i1, i2, i3, and i4, a digital sample of m bits representative of the signal level, where m is an integer greater than 1, for example in the range from 8 to 24. As an example, number m of bits of the output samples may be equal to $\log_2(N)$ for a delta-sigma modulator of order 1. For each pixel of the sensor, complex field E of the object beam received by the sensor may be determined by formula $E_O=(i1-i3)+j(i2-i4)$, component i1–i3 corresponding to the real part of field $E_O$, and component i2–i4 corresponding to the imaginary part of field $E_O$. Phase $P_O$ and amplitude $A_O$ of the object signal received by each pixel of the sensor may be determined by the following formulas:

$$P_O = \arctan((i2-i4)/(i1-i3)), \text{ and } A_O = \sqrt{(i1-i3)+(i2-i4)^2}.$$

It should be noted that ratio n of beat frequency $f_B$ of the system to oversampling frequency $f_{Cs}$ of the image sensor may be an integer different from 4, for example, n=2, n=3, or n=5. In this case, the operating principle is similar to what has been previously described, but the formulas of reconstruction of the complex field of the object signal are different.

In the above-mentioned example where n=4, to decrease constraints relative to the dynamic range of the oversampling analog-to-digital converter, subtraction operations i1–i3 and i2–i4 may be performed before the supply of the digitized samples over m bits, for example, at the time of the acquisition of analog values $i1_i$, $i2_i$, $i3_i$, and $i4_i$ as will be explained in further detail in relation with the examples of sensor of FIGS. 8 and 9. In this case, it is come back down to the observation, during the acquisition period of duration $N*T_B$, of two DC signals i1–i3 and i2–i4, each of the two signals being sampled at frequency $f_B$. The oversampling analog-to-digital converter coupled to the photodiode then enables to provide, at the end of acquisition period $N*T_B$, for each of the two observed DC signals i1–i3 and i2–i4, a digital m-bit sample representative of the signal level. An advantage is that DC component $a_0$ of the signal received by each pixel of the sensor is removed before the actual phase of digitization by the analog-to-digital converter, which decreases constraints relative to the converter dynamic range. The described embodiments are however not limited to this specific solution. As a variation, differences i1–i3 and i2–i4 may be calculated on digital 1-bit samples within one or a plurality of counters of a digital filter of the oversampling converter.

Figure 8:
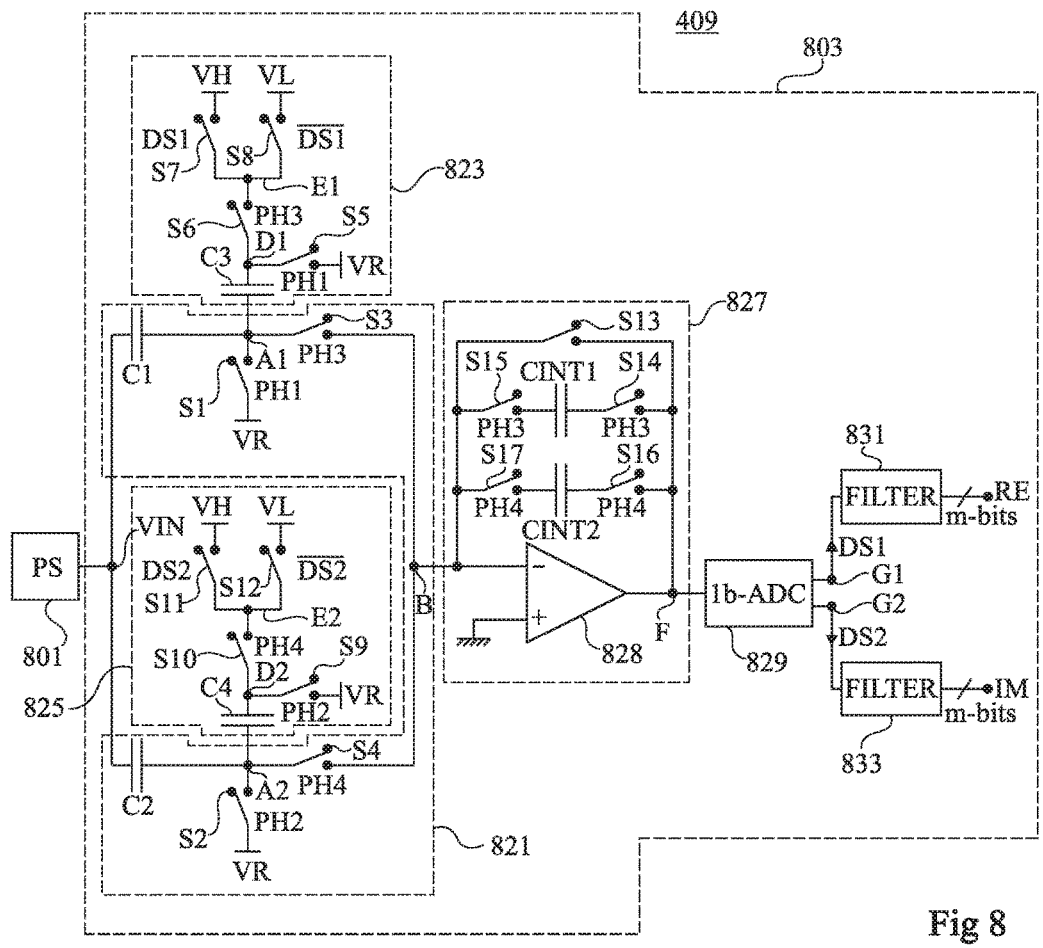
FIG. 8 schematically and partially shows an embodiment of an image sensor of a system for acquiring images by heterodyne digital holography.

FIG. 8 schematically and partially shows a non-limiting embodiment of image sensor 409 of the image acquisition systems of FIGS. 4 and 5, in the case where n=4.

FIG. 8 only shows one pixel 801 of sensor 409. Pixel 801 may comprise a photodiode (not shown) and one or a plurality of control transistors (not shown). In practice, sensor 409 may comprise a plurality of pixels identical or similar to pixel 801, for example, arranged in an array. Sensor 409 further comprises an oversampling analog-to-digital conversion circuit 803 coupled to pixel 801. In this example, circuit 803 has an analog input node VIN connected to a node for supplying an output signal of pixel 801, and two digital outputs RE and IM of m bits each, capable of supplying digital signals respectively representative of the real part and of the imaginary part of the complex field of the object beam at the level of pixel 801. In practice, sensor 409 may comprise a plurality of oversampling analog-to-digital conversion circuits similar or identical to circuit 803. As an example, sensor 409 may comprise one analog-to-digital conversion circuit per pixel of the sensor. As a variation, to decrease the total surface area of the sensor, an analog-to-digital conversion circuit may be shared by a plurality of sensor pixels by means of multiplexers.

Circuit 803 comprises an analog sampling block 821, capable of acquiring in one or a plurality of capacitors analog samples of the output signal of pixel 801 at oversampling frequency $f_{Cs}$ of the sensor, that is, four samples $i1_i$, $i2_i$, $i3_i$, and $i4_i$ per beat period $T_B$ of the system in the present example. Block 821 is further capable of analogically performing, for each beat period $T_B$ of acquisition period $N*T_B$, arithmetic operations on the acquired analog samples. More particularly, in this example, block 821 is capable of analogically calculating, for each beat period $T_B$, differences $i1_i-i3_i$ and $i2_i-i4_i$.

In the example of FIG. 8, block 821 comprises a capacitor C1 connecting node VIN to a node A1, a capacitor C2 connecting node VIN to a node A2, a switch S1 connecting node A1 to a node of application of a first reference voltage VR, a switch S2 connecting node A2 to node VR, a switch S3 connecting node A1 to output node B of block 821, and a switch S4 connecting node A2 to node B.

Circuit 803 further comprises a first analog-to-digital conversion circuit or block 823, capable of converting to analog a digital input signal DS1 of 1 bit per sample and of subtracting the resulting analog signal from analog signal $i1_i-i3_i$ calculated by block 821, and a second analog-to-digital conversion circuit or block 825, capable of converting to analog a digital input signal DS2 of 1 bit per sample and of subtracting the resulting analog signal from analog signal $i2_i-i4_i$ calculated by block 821.

In the example of FIG. 8, block 823 comprises a capacitor C3 connecting node A1 to a node D1, a switch S5 connecting node D1 to node VR, a switch S6 connecting node D1 to a node E1, a switch S7 connecting node E1 to a node of application of a second reference potential VH, for example, greater than potential VR, and a switch S8 connecting node E1 to a node of application of a third reference potential VL smaller than potential VH, for example, smaller than potential VR. Switch S7 has a control node receiving digital signal DS1 to be converted, and switch S8 has a control node receiving the complementary of signal DS1. Further, in the example of FIG. 8, block 825 comprises a capacitor C4 connecting node A2 to a node D2, a switch S9 connecting node D2 to node VR, a switch S10 connecting node D2 to a node E2, a switch S11 connecting node E2 to node VH, and a switch S12 connecting node E2 to node VL. Switch S11 has a control node receiving digital signal DS2 to be converted, and switch S12 has a control node receiving the complementary of signal DS2.

Circuit 803 further comprises an integrator 827 capable of separately integrating components i1–i3 and i2–i4 of the output signal of pixel 801.

In the example of FIG. 8, integrator 827 comprises a differential amplifier 828 having a positive input (+) connected to a node of application of a reference potential, for example, the ground, and having a negative input (−) connected to node B. Differential amplifier 828 further comprises an output F coupled to node B by three parallel branches: a first branch comprising a reset switch S13 connecting node F to node B; a second branch comprising, in series between node F and node B, a switch S14, a first integration capacitor CINT1, and a switch S15; and a third branch comprising, in series between node F and node B, a switch S16, a second integration capacitor CINT2, and a switch S17.

Circuit 803 further comprises a 1-bit analog-to-digital converter 829 comprising an analog input connected to output node F of integrator 827. In the example of FIG. 8, converter 829 comprises two digital outputs G1 and G2 of 1 bit each. Converter 829 is capable of providing on its output G1, at frequency $f_{CS}/4$, a sequence of 1-bit samples representative of difference i1–i3, forming signal DS1, and, on its output G2, at frequency $f_{CS}/4$, a sequence of 1-bit samples representative of difference i2–i4, forming signal DS2. Output G1 of converter 829 may be directly connected to the control node of switch S7 and connected to the control node of switch S8 via an inverter. Output G2 of converter 829 may be directly connected to the control node of switch S11 and connected to the control node of switch S12 via an inverter.

Converter 829 may for example comprise a comparator (not shown) having an input connected to node F and having an output, supplying a binary signal representative of the result of the comparison of the input signal with a threshold, connected to output G1 of the converter via a first delay cell or flip-flop (not shown), and to output G2 of the converter via a second delay cell or flip-flop (not shown).

Circuit 803 further comprises a first digital filtering circuit 831 (FILTER) which receives as an input the intermediate 1-bit samples provided by converter 829 on its output G1. Circuit 831 is capable of supplying, at the end of an acquisition period $N*T_B$, on a m-bit output connected to output RE of circuit 803, a digital m-bit sample representative of difference i1–i3. Circuit 803 further comprises a second digital filtering circuit 833 (FILTER) which receives as an input the intermediate 1-bit samples provided by converter 829 on its output G2. Circuit 833 is capable of supplying, at the end of an acquisition period $N*T_B$, on a m-bit output connected to output IM of circuit 803, a digital sample representative of difference i2–i4. As an example, each of circuits 831 and 833 comprises a counter which adds the values of N successive samples of signals DS1 and DS2, respectively, circuit 831 supplying on output RE the result of the sum of the N successive samples of signal DS1, and circuit 833 supplying on output IM the result of the sum of the N successive samples of signal DS2. In this case, number m of bits of the output samples is equal to $\log_2(N)$.

An example of operation of circuit 803 of FIG. 8 will now be described. During a period $N*T_B$ of acquisition of the complex field of the object beam at the pixel level, for each beat period $T_B$ of the system, switches S1 to S6, S9, S10 and S13 to S17 are controlled as follows:

initially, switches S13, S14, S15, S16, and S17 are on (conductive) and the other switches are off (non-conductive);

during a first acquisition period PH1 substantially corresponding to the first quarter of period $T_B$, switches S1 and S5 are on (conductive) and switches S2 to S4, S6, S9, S10, and S13 to S17 are off (non-conductive);

during a second acquisition period PH2 substantially corresponding to the second quarter of period $T_B$, switches S2 and S9 are on and switches S1, S3 to S6, S9, S10, and S13 to S17 are off;

during a third acquisition period PH3 substantially corresponding to the third quarter of period $T_B$, switches S3, S6, S14, and S15 are on and switches S1, S2, S4, S5, S9, S10, S13, S16, and S17 are off; and during a fourth acquisition period PH4 substantially corresponding to the fourth quarter of period $T_B$, switches S4, S10, S16, and S17 are on and switches S1 to S3, S5, S6, S9, and S13 to S15 are off.

Thus, during each period PH3, the analog result of difference $i1_i - i3_i$, having the analog value of the feedback signal driven by signal DS1 subtracted therefrom, is integrated in capacitor CINT1, and the result of the integration is applied to the input of 1-bit analog conversion circuit 829. Further, during each period PH4, the analog result of difference $i2_i - i4_i$, having the analog value of the feedback signal driven by signal DS2 subtracted therefrom, is integrated in capacitor CINT2, and the result of the integration is applied to the input of 1-bit analog conversion circuit 829.

In this example, circuit 829 controlled to acquire and deliver on its output G1, at each period PH3, a sample corresponding to the digitization over 1 bit of output F of integrator 827, and to acquire and supply on its output G2, for each period PH4, a sample corresponding to the digitization over 1 bit of output F of the integrator.

After a period $N*T_B$ of acquisition of the complex field of the object beam at the level of pixel 801, circuit 803 may be reset by the turning-on of switches S13, S14, S15, S16, and S17.

Figure 9:
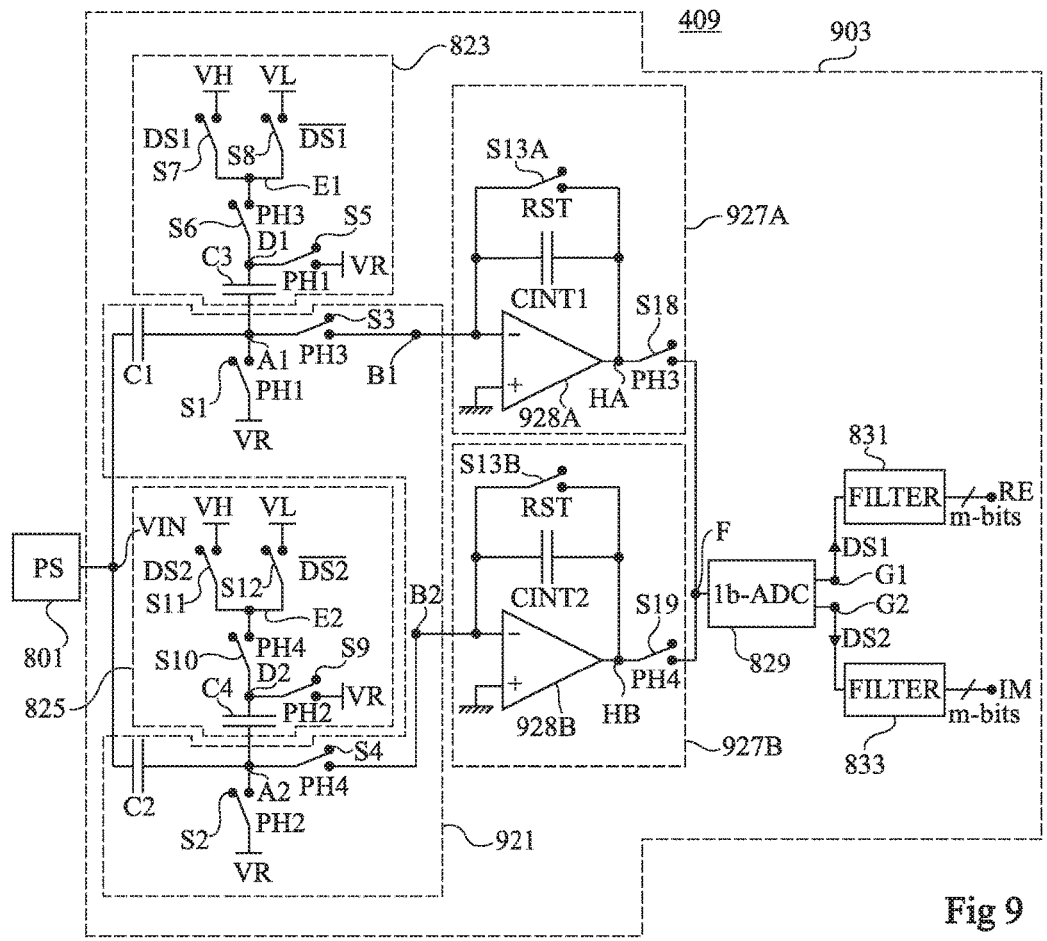
FIG. 9 schematically and partially shows an alternative embodiment of an image sensor of a system for acquiring images by heterodyne digital holography.

FIG. 9 schematically and partially shows an alternative embodiment of image sensor 409 of FIG. 8. The image sensor of FIG. 9 comprises many elements common with the sensor of FIG. 8. After, only the differences between the sensors of FIGS. 8 and 9 will be detailed.

FIG. 9 only shows one pixel 801 of sensor 409. In practice, sensor 409 may comprise a plurality of pixels identical or similar to pixel 801, for example, arranged in an array. Sensor 409 further comprises an oversampling analog-to-digital conversion circuit 903 coupled to pixel 801. In this example, circuit 903 has an analog input node VIN connected to a node for supplying an output signal of pixel 801, and two digital outputs RE and IM of m bits each (with $m=\log_2(N)$ in the case of a converter of order 1), capable of supplying digital signals respectively representative of the real part and of the imaginary part of the complex field of the object beam at the level of pixel 801. In practice, sensor 409 may comprise a plurality of oversampling analog-to-digital conversion circuits similar or identical to circuit 903. As an example, sensor 409 may comprise one analog-to-digital conversion circuit per pixel of the sensor. As a variation, to decrease the total surface area of the sensor, an analog-to-digital conversion circuit may be shared by a plurality of sensor pixels by means of multiplexers.

Circuit 903 comprises elements common with circuit 803 of FIG. 8. Only the differences between the two circuits will be detailed hereafter.

Circuit 903 comprises an analog sampling circuit or block 921 similar to block 821 of FIG. 8. Block 921 of FIG. 9 differs from block 821 of FIG. 8 only by the fact that instead of comprising a single output node B connected to node A1 by switch S3 on the one hand, and to node A2 by switch S4 on the other hand, two different output nodes B1 and B2 respectively connected to node A1 by switch S3 and to node A2 by switch S4.

Another difference between circuit 903 of FIG. 9 and circuit 803 of FIG. 8 is that circuit 903 does not comprise, as in circuit 803, an integrator 827 with a double integration capacitor, but comprises instead two integrators 927A and 927B with a simple integration capacitor. Integrator 927A is capable of integrating component i1–i3 of the output signal of pixel 801, and integrator 927B is capable of integrating component i2–i4 of the output signal of pixel 801.

In the example of FIG. 9, integrator 927A comprises a differential amplifier 928A having a positive input (+) connected to a node of application of a reference potential, and having a negative input (−) connected to node B1, and integrator 927B comprises a differential amplifier 928B having a positive input (+) connected to a node of application of a reference potential, for example, the ground, and having a negative input (−) connected to node B2. Differential amplifier 928A comprises an output HA coupled to node B1 by two parallel branches: a first branch comprising a reset switch S13A; and a second branch comprising an integration capacitor CINT1. Further, differential amplifier 928B comprises an output HB coupled to node B2 by two parallel branches: a first branch comprising a reset switch S13B; and a second branch comprising an integration capacitor CINT2. In the example of FIG. 9, node HA is connected to input node F of I-bit analog-to-digital converter 829 by a switch S18 and node HB is connected to node F by a switch S19.

The operation of circuit 903 of FIG. 9 is similar to that of circuit 803 of FIG. 8. In particular, switches S1 to S6, S9, and S10 of circuit 903 may be controlled in the same way as in circuit 803 of FIG. 8. In circuit 903, switch S18 may be off during operating phases PH1, PH2, and PH4 and on during operating phases PH3, and switch S19 may be off during operating phases PH1, PH2, and PH3 and on during operating phases PH4. After a period $N*T_B$ of acquisition of the complex field of the object beam at the level of pixel 801, circuit 903 may be reset by the turning-on of switches S13A and S13B (the other switches being off).

An advantage of the sensor of FIG. 9 over the sensor of FIG. 8 is that it enables to limit error risks due to possible interference or crosstalk phenomena between integration capacitors CINT1 and CINT2.

It should be noted that in an oversampling image sensor of the system for acquiring images by heterodyne digital holography, for example, a sensor of the type described in relation with FIGS. 8 and 9, especially when DC component $a_0$ (FIG. 7) of the signal received by a sensor pixel is significant as compared with AC component $a_1$, it may be advantageous to filter component a before the analog sampling of the signal by the oversampling modulator (formed by blocks 821, 823, 825, 827, and 829 in the example of FIG. 8 and by blocks 921, 823, 825, 927A, 927B, and 829 in the example of FIG. 9). Examples of circuits capable of performing such a high-pass filtering function will now be described in relation with FIGS. 10, 11, and 12.

Figures 10, 11:
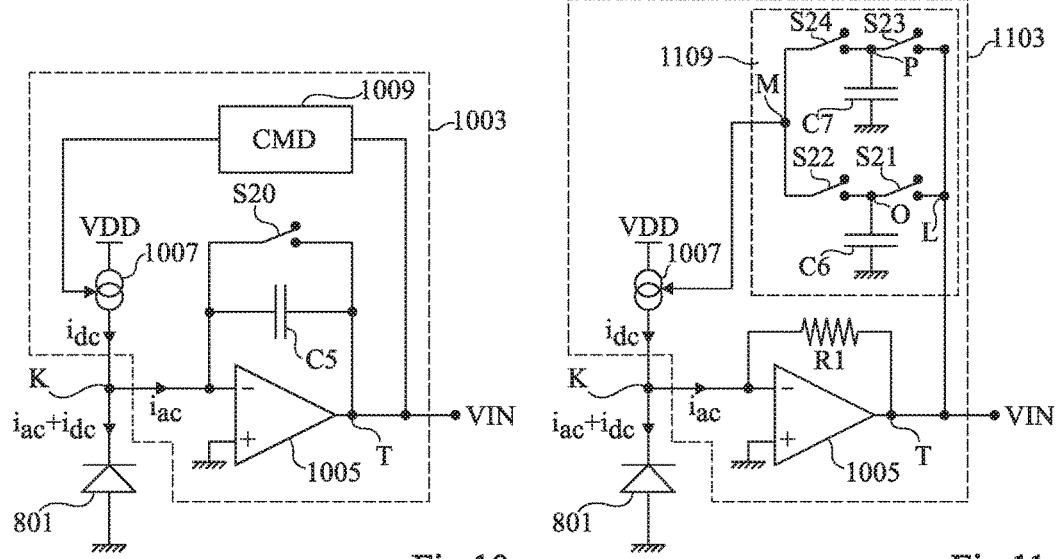
FIGS. 10 to 12 schematically and partially show other alternative embodiments of an image sensor of a system for acquiring images by heterodyne digital holography.

FIG. 10 schematically and partially shows an embodiment of an image sensor comprising at least one pixel 801 and one pixel output signal high-pass filtering circuit 1003. As an example, in an oversampling sensor, filtering circuit 1003 may be placed between the output of pixel 801 and input VIN of the oversampling modulator of the sensor.

In the example of FIG. 10, pixel 801 comprises a photodiode reverse biased by a constant reference voltage VDD and supplying on its cathode K a current representative of the light intensity received by the pixel. Pixel 801 may further comprise various control elements, not shown. In an application to a system for acquiring images by heterodyne digital holography of the above-described type, the current supplied by the photodiode comprises a DC component $i_{dc}$ which corresponds to DC component $a_0$ of the light signal received by the pixel, and an AC component $i_{ac}$ which corresponds to the AC component $a_1$ of the light signal received by the pixel.

Filter 1003 comprises a differential amplifier 1005 having a positive input (+) connected to a node of application of a reference potential, for example, to ground, and having a negative input (−) connected to cathode K of the photodiode. Differential amplifier 1005 further comprises an output node T which may be connected to node VIN. Node T is coupled to node K by two parallel branches: a first branch comprising a reset switch S20; and a second branch comprising an integration capacitor C5. Filter 1003 further comprises a controllable current source 1007 connecting node K to a node of application of bias voltage VDD of the photodiode. Filter 1003 further comprises an analog circuit 1009 for controlling (CMD) source 1007, having one input connected to node T and one output connected to a control node of source 1007.

In operation, capacitor C5 charges to a value representative of the average value of the current received on the negative input of differential amplifier 1005, which is itself equal to the difference between the current delivered by the photodiode and the current delivered by source 1007. Control circuit 1009 controls current source 1007 so that it delivers a DC current representative of the average of the output signal of amplifier 1005. The output signal provided on node T converges towards an AC voltage centered on a constant average value. This AC voltage is representative of the AC component only of the light signal received by the pixel. Filter 1003 may be reset by the turning-on of switch S20.

FIG. 11 schematically and partially shows another embodiment of an image sensor comprising at least one pixel 801 and one pixel output signal high-pass filtering circuit 1103. As an example, in an oversampling sensor, filtering circuit 1103 may be placed between the output of pixel 801 and input VIN of the oversampling modulator of the sensor.

In the example of FIG. 11, pixel 801 is identical or similar to pixel 801 of FIG. 10.

Filter 1103 comprises, as in the example of FIG. 10, a differential amplifier 1005 having its positive input (+) connected to a node of application of a reference potential, for example, to ground, and having its negative input (−) connected to cathode K of the photodiode. Output node T of amplifier 1005 may be connected to the input node VIN of an oversampling modulator. In this example, node T is connected to node K by a resistor R1 or a capacitor (not shown). Filter 1103 further comprises a controllable current source 1007 connecting node K to a node of application of bias voltage VDD of the photodiode. Filter 1103 further comprises a circuit 1109 for controlling current source 1007, the circuit comprising an input node L connected to node T and an output node M connected to a control node of current source 1007. Control circuit 1109 comprises a capacitor C6 connecting a node O to a node of application of a reference potential, for example, to ground, and a capacitor C7 connecting a node P to a node of application of a reference potential, for example, to ground. Circuit 1109 further comprises a switch S21 connecting node L to node O, a switch S22 connecting node O to node M, a switch S23 connecting node L to node P, and a switch S24 connecting node P to node M.

In operation, for each beat period $T_B$ of the light signal received by pixel 801, the level of the output signal of amplifier 1005 may be sampled in capacitors C6 and C7 at two different times shifted by Pi. To achieve this, switch S21 is turned on and switches S22, S23, and S24 are turned off at a first time t0, after which switch S23 is turned on and switches S21, S22, and S24 are turned off at a second time t1=t0+$T_B$/2. After time t1, switches S24 and S22 may be turned on, which amounts to applying to node M a signal representative of the average of the output signal of amplifier 1005. The output signal provided on node T converges towards an AC voltage centered on a constant average value. This AC voltage is representative of the AC component only of the light signal received by the pixel.

An advantage of the high-pass filtering circuit of FIG. 11 is that it enables to efficiently amplify the AC portion $i_{ac}$ of the output signal of the photodiode. Further, the operation of circuit 1103 comprises no reset phase.

Figure 12:
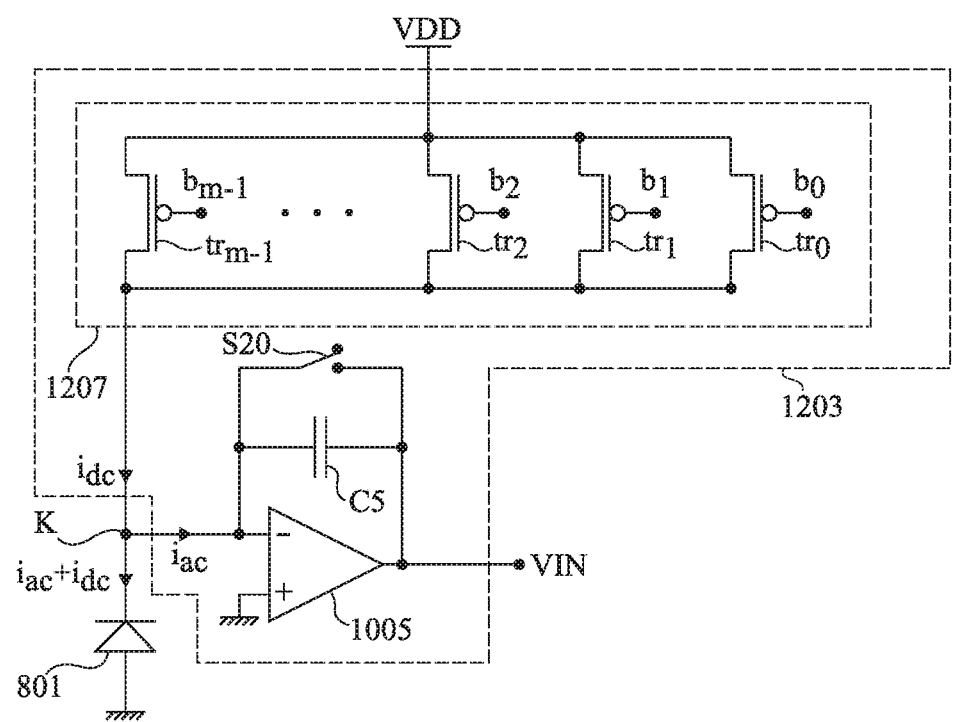

FIG. 12 schematically and partially shows another embodiment of an image sensor comprising at least one pixel 801 and one pixel output signal high-pass filtering circuit 1203. As an example, in an oversampling sensor, filtering circuit 1203 may be placed between the output of pixel 801 and input VIN of the oversampling modulator of the sensor.

In the example of FIG. 12, pixel 801 is identical or similar to pixel 801 of FIGS. 11 and 12. Filter 1203 comprises, as in the example of FIG. 10, a differential amplifier 1005 having its positive input (+) connected to a node of application of a reference potential, for example, to ground, and having its negative input (−) connected to cathode K of the photodiode. Output node T of amplifier 1005 may be connected to input node VIN of an oversampling modulator. Node T is further coupled to node K by two parallel branches: a first branch comprising a reset switch S20; and a second branch comprising an integration capacitor C5. In this example, filter 1203 further comprises a controllable current source 1207 connecting node K to a node of application of bias voltage VDD of the photodiode.

A difference between filter 1203 of FIG. 12 and filter 1003 of FIG. 10 is that, in filter 1203, current source 1207 is a digitally-controlled source. In the case of an oversampling image sensor, for example, a sensor of the type described in relation with FIGS. 8 and 9, current source 1207 may be controlled by a digital signal corresponding to an output signal of the oversampling analog-to-digital converter. One may for example provide, before the phase of acquisition of the complex field of the object beam at the level of pixel 801, a phase of acquisition of a signal for controlling current source 1207. An advantage of this embodiment is that it enables to reuse the equipment of the oversampling sensor and particularly the oversampling converter to generate a signal for controlling the current source via a binary search for the average value of the signal.

In the shown example, current source 1207 comprises m P-channel MOS transistors $tr_0, tr_1, tr_2, \ldots, tr_{m-1}$ in parallel between node VDD and node K, each transistor receiving on its control gate, respectively $b_0, b_1, b_2, \ldots, b_{m-1}$, one bit of the control signal. In this example, transistors $tr_0, tr_1, tr_2, \ldots, tr_{m-1}$ have different sizes, which enables to take into account the weight of the different bits of the word for controlling source 1207. As a non-limiting example, if transistor $tr_0$ has a channel width W and a channel length L, transistor $tr_1$ may have a width-to-length ratio equal to $2*W/L$, transistor $tr_2$ may have a width-to-length ratio equal to $4*W/L$, and so on until transistor $tr_{m-1}$, which may have a width-to-length ratio equal to $2^{m-1}*W/L$.

In addition to the above-mentioned advantages of simplification and cost and bulk decrease, an advantage of the embodiments described in the present application is that they enable to form systems for acquiring images by heterodyne digital holography where the constraints associated with sensor pixel saturation risks are largely attenuated as compared with existing systems. Indeed, in the described embodiments, the photodiode reset frequency can be much higher than in existing systems, which enables, in particular, to use higher light intensities to illuminate the object to be examined or analyzed.

Another advantage of the described embodiments is that they enable to form systems for acquiring images by heterodyne digital holography having, at the output of the acquisition system, a better signal-to-noise ratio than existing systems. Such an improvement of the signal-to-noise ratio is particularly due to the fact that the use of an analog-to-digital converter enables to decrease the noise of the quantization system as compared with existing systems. The improvement of the signal-to-noise ratio may further be amplified by the use of a high-pass filtering circuit of the type described in relation with FIGS. 10 to 12. The suppressing of the DC signal before conversion of the residual AC signal enables, in particular, to focus the quantization resources on the AC component only, which especially enables to decrease the oversampling factor necessary to obtain a useful output signal quantized over a given number of bits. Further, the residual error of this DC component filtering phase is suppressed by the integration of the difference between two samples at the level of the integrator of the delta-sigma modulator.

It should be noted that, in systems for acquiring images by heterodyne digital holography of the type described in relation with FIG. 3, using an emitter of a focused ultrasound wave to excite a portion of the sample to be analyzed, methods have already been provided to improve the axial resolution of the system, that is, the resolution along the ultrasound wave propagation axis. Examples of such methods are described, in particular, in Emilie Benoit a la Guillaume et al.'s above-mentioned article, in the article entitled "Theoretical study of Acousto-optic coherence tomography using random phase jumps on US and light" of M. Lesaffre et al., and in the article entitled "Acousto-optic coherence tomography using random phase jumps on ultrasound and light" of M. Lesaffre et al., which are herein incorporated by reference.

According to a first method of improving the axial resolution in a system of the type described in relation with FIG. 3, it is provided to emit the ultrasound excitation wave in pulses or time slots of duration Δt. Acousto-optic modulator MAO1 of the reference path is then also activated in pulsed fashion, for slots of duration Δt, shifted by a time τ with respect to the ultrasound wave emission slots. The sample portion capable of being analyzed by the system is then that excited by the ultrasound pulse during slots for which acousto-optic modulator MAO1 of the reference path is active. Thus, the axial resolution of the system is approximately equal to $\Delta t^* V_{US}$, where $V_{US}$ is the propagation speed of the ultrasound wave in the analyzed sample, and the distance between the ultrasound emitter and the portion of the sample visible by the system is approximately equal to $\tau^* V_{US}$.

This first method can be adapted to a system of the type described in relation with FIG. 5, where the image sensor is an oversampling sensor, and where the reference path comprises no acousto-optic modulator. The focused ultrasound wave for exciting the sample then is, as in known methods, emitted in pulses or time slots of duration Δt. However, in such a system, it may be difficult to apply the time slots shifted by duration τ setting the distance between the ultrasound emitter and the sample portion effectively analyzed on the reference path, the latter comprising no acousto-optic modulator. It is thus provided to apply the time slots to the actual oversampling converter, via a digital control signal. More particularly, the modulator of the oversampling converter comprises a node of application of a binary activation signal BURST_ON, defining the time slots of selection of the analyzed sample portion. During an activation slot of signal BURST_ON, of duration Δt, the modulator is active and acquires and processes analog samples of the input signal identically or similarly to what has been described hereabove. Outside of the activations slots of signal BURST_ON, the modulator is inhibited and stops acquiring samples of the input signal. The effect is then the same as if the slots were applied to the reference path. The activation slots of signal BURST_ON are preferably synchronous with the operating phases of the sigma-delta modulator. In particular, their duration Δt is preferably equal to a multiple of the oversampling period of the converter.

Figure 13:
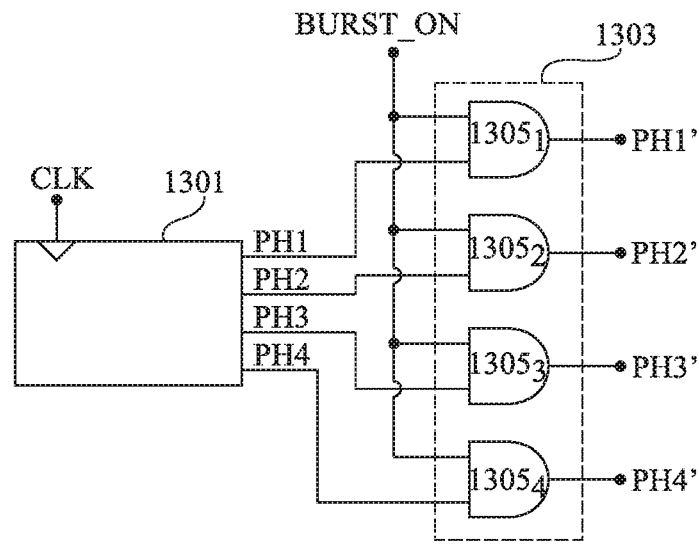
FIG. 13 is a simplified diagram of an example of a circuit for controlling an oversampling analog-to-digital converter of a sensor of the type described in relation with FIGS. 8 or 9.

FIG. 13 is a simplified diagram of a circuit for controlling an oversampling analog-to-digital converter of a sensor of the type described in relation with FIG. 8 or 9, capable of receiving activation signal BURST_ON and of controlling the acquisition of samples of the input signal only when signal BURST_ON is in the active state (high state in the present example).

The circuit of FIG. 13 comprises a circuit 1301, rated by a clock signal CLK, capable of generating signals PH1, PH2, PH3, and PH4 for controlling the switches of an oversampling converter of the type described in relation with FIG. 8 or 9 (it being understood that in the examples of FIGS. 8 and 9, signal PH1 is the signal for controlling switches S1 and S5, signal PH2 is the signal for controlling switches S2 and S9, signal PH3 is the signal for controlling switches S3, S6, S14, S15, and S18, and signal PH4 is the signal for controlling switches S4, S10, S16, S17, and S19).

The circuit of FIG. 13 further comprises an activation circuit 1303 comprising four AND gates $1305_1$, $1305_2$, $1305_3$ and $1305_4$, each having two binary inputs and one binary output. AND gates $1305_1$, $1305_2$, $1305_3$ and $1305_4$ receive, on a first input, signal BURST_ON and, on a second input, respectively signals PH1, PH2, PH3 and PH4 generated by circuit 1301. The outputs of AND gates $1305_1$, $1305_2$, $1305_3$ and $1305_4$ respectively provide binary signals PH1', PH2', PH3' and PH4'. Signals PH1', PH2', PH3', and PH4' are identical to signals PH1, PH2, PH3 and PH4 when signal BURST_ON is in the active state (high state in the present example) and are in the low state when signal BURT_ON is in the inactive state (low state in the present example).

In the example of FIG. 13, signals PH1', PH2', PH3', and PH4' are intended to control switches S1, S5, S2, S9, S3, S6, S14 S15, S18, S4, S10, S16, S17, and S19 instead of signals PH1, PH2, PH3, and PH4 of the examples of FIGS. 8 and 9. Thus, when signal BURST_ON is in the high state, the converter behaves as previously described, and acquires samples of the input signal at oversampling frequency $f_{Cs}$ of the sensor. When signal BURST_ON is in the low state, switches S1, S5, S2, S9, S3, S6, S14, S15, S18, S4, S10, S16, S17, and S19 are kept off, so that the converter stops acquiring samples until the next activation of signal BURST_ON.

According to a second method of improving the axial resolution in a system of the type described in relation with FIG. 3, it is provided to apply to the ultrasound wave for exciting the sample a random or pseudo-random sequence of phase jumps by 0 or π, at a frequency setting the axial resolution of the system. The same phase jump sequence is also applied to the reference path via acousto-optic modulator MAO1, with a time shift of duration τ with respect to the sequence applied to the ultrasound wave. The sample portion seen by the system then is that in which the phase jump sequence applied to the ultrasound wave coincides in time with the phase jump sequence applied to the reference beam. Thus, the axial resolution of the system is approximately equal to $\Delta t^* V_{US}$, where Δt is the period of application of the phase jumps and $V_{US}$ is the propagation speed of the ultrasound wave in the analyzed sample, and the distance between the ultrasound emitter and the portion of the sample visible by the sensor is approximately equal to $\tau^* V_{US}$.

This second method can be adapted to a system of the type described in relation with FIG. 5, where the image sensor is an oversampling sensor, and where the reference path comprises no acousto-optic modulator. A random or pseudo-random sequence of phase jumps by 0 or π, at a rate 1/Δt setting the axial resolution of the system, is then applied to the ultrasound wave. However, in such a system, it may be difficult to apply the same sequence, shifted by a duration τ setting the distance between the ultrasound emitter and the analyzed sample portion, to the reference path, the latter comprising no acousto-optic modulator. It is thus provided to apply this sequence in the actual oversampling converter, via a digital control signal. The effect is then the same as if the phase jump sequence was applied to the reference path.

Figure 14:
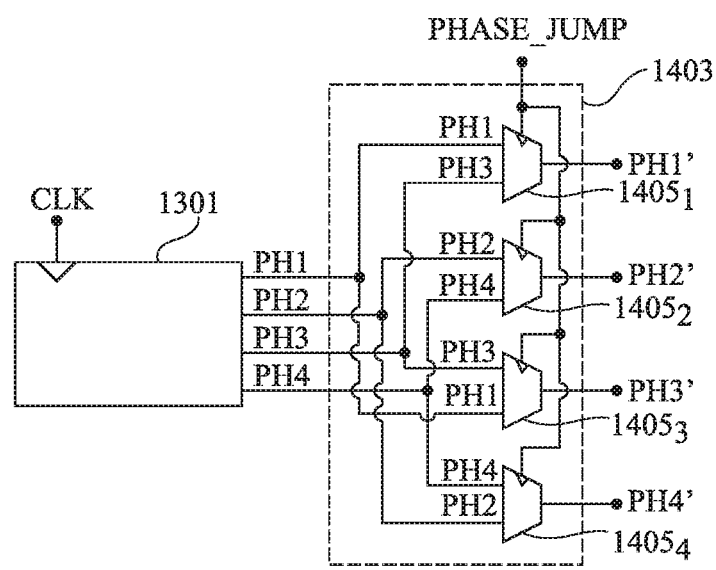
FIG. 14 is a simplified diagram of another example of a circuit for controlling an oversampling analog-to-digital converter of a sensor of the type described in relation with FIGS. 8 or 9.

FIG. 14 is a simplified diagram of a circuit for controlling an oversampling analog-to-digital converter of a sensor of the type described in relation with FIG. 8 or 9, capable of receiving a random binary signal PHASE_JUMP representative of a phase jump sequence identical to that applied to the ultrasound wave, but shifted by duration τ with respect to the sequence applied to the ultrasound wave, and of controlling phase inversions in the sequence of acquisition of samples of the input signal each time signal PHASE_JUMP switches state. In this example, the high state of signal PHASE_JUMP corresponds to a π phase shift, and the low state of signal PHASE_JUMP corresponds to a zero phase shift.

As in the example of FIG. 13, the circuit of FIG. 14 comprises a circuit 1301, rated by a clock signal CLK, capable of generating signals PH1, PH2, PH3, and PH4 for controlling the switches of an oversampling converter of the type described in relation with FIG. 8 or 9.

The circuit of FIG. 14 further comprises a phase inversion circuit 1403 comprising four two-input-to-one-output multiplexers $1405_1$, $1405_2$, $1405_3$ and $1405_4$. Multiplexer $1405_1$ respectively receives on its first and second inputs signals PH1 and PH3, multiplexer $1405_2$ respectively receives on its first and second inputs signals PH2 and PH4, multiplexer $1405_3$ respectively receives on its first and second inputs signals PH3 and PH1, and multiplexer $1405_4$ respectively receives on its first and second inputs signals PH4 and PH2. Multiplexers $1405_1$, $1405_2$, $1405_3$ and $1405_4$ respectively output binary signals PH1', PH2', PH3' and PH4'. Each multiplexer further comprises a selection input receiving signal PHASE_JUMP. Signals PH1', PH2', PH3' and PH4' are identical to signals PH1, PH2, PH3 and PH4 when signal PHASE_JUMP is in the low state (zero phase shift) and signals PH1', PH2', PH3' and PH4' are respectively identical to signals PH1, PH2, PH3 and PH4 when signal PHASE_JUMP is in the high state (phase shift equal to π). Thus, when signal PHASE_JUMP is in the high state, operating phases PH1 and PH3, respectively PH2 and PH4 of the oversampling converter are inverted. It should be noted that in the present example, a time consistency between frequency 1/Δt of application of the phase jumps and sampling frequencies PH1, PH2, PH3 and PH4 of the pixels should be respected.

More generally, it will be within the abilities of those skilled in the art to adapt to other oversampling converter structures the above-mentioned methods of improving the axial resolution of the system.

Specific embodiments have been described. Various alterations, modifications, and improvements will readily occur to those skilled in the art.

In particular, the described embodiments are not limited to the specific examples of oversampling image sensors described in relation with FIGS. 8 and 9. More generally, it will be within the abilities of those skilled in the art to obtain the desired operation by using other oversampling image sensor architectures. It will further be within the abilities of those skilled in the art to adapt the described architectures to the case where ratio n of beat frequency $f_B$ of the system to oversampling frequency $f_{C_S}$ of the sensor is different from 4, and where the formulas for reconstructing the complex field of the object beam are different from the above-mentioned formulas.

Further, the described embodiments are not limited to the examples of operating frequency ranges mentioned in the present disclosure.

What is claimed is:

1. A system for acquiring images by heterodyne digital holography, comprising:
    an image sensor having at least one photodiode coupled to an analog-to-digital converter; and
    an optical assembly enabling to simultaneously project on the sensor first and second coherent light beams of different frequencies,
    wherein the converter is capable of acquiring, at a first frequency, analog samples representative of an output signal of the photodiode, of generating, at a second frequency equal to the first frequency or to a submultiple of the first frequency first digital samples having a first resolution based on said analog samples, and of providing at a third frequency equal to a submultiple of the second frequency second digital samples having a resolution greater than the first resolution, generated from the first digital samples,
    and wherein the first frequency of the converter is equal to an integral number n of times the system beat frequency ($f_B$), that is, the absolute value of the difference between the frequencies of the first and second beams.

2. The system of claim 1, wherein the optical assembly comprises a single acousto-optic modulator.

3. The system of claim 1, wherein the optical assembly comprises no acousto-optic modulator, and comprises an ultrasound source for exciting an object crossed by the second light beam.

4. The system of claim 3, wherein the ultrasound source is capable of emitting an ultrasound wave during a first time interval of duration Δt, and wherein the converter is capable of only acquiring samples representative of an output signal of the photodiode during a second time interval of same duration Δt, time-shifted with respect to the first time interval.

5. The system (500) of claim 3, wherein the ultrasound source is capable of emitting an ultrasound wave having a first random or pseudo-random sequence of phase jumps by 0 or π, and wherein the converter is capable of receiving a binary signal representative of a second sequence of phase jumps identical to the first sequence but time-shifted with respect to the first sequence, and of modifying an analog sample processing sequence according to this binary signal.

6. The system of any of claim 1, wherein n is equal to 4.

7. The system of claim 1, wherein the converter comprises an analog sampling block capable of acquiring n analog samples of an output signal of the photodiode at each beat period of the system.

8. The system of claim 7, wherein the analog sampling block is capable of analogically performing, for each beat period, one or a plurality of arithmetic operations based on said samples.

9. The system of claim 7, wherein the converter is capable of providing, after an integral number N of beat periods of the system, a first digital signal over m bits, representative of the real part of the complex field of the second light beam, and a second digital signal over m bits, representative of the imaginary part of the complex field of the second light beam, where m is an integer greater than or equal to 1.

10. The system of claim 9, wherein m is equal to $\log_2(N)$.

11. The system of claim 1, wherein the converter comprises an integrator comprising two integration capacitors.

12. The system of claim 1, wherein the converter comprises two integrators each comprising an integration capacitor.

13. The system of claim 1, wherein the sensor further comprises a high-pass filtering circuit between the photodiode and the converter.

* * * * *